(12) United States Patent
Chang et al.

(10) Patent No.: US 11,361,971 B2
(45) Date of Patent: Jun. 14, 2022

(54) HIGH ASPECT RATIO BOSCH DEEP ETCH

(71) Applicant: Taiwan Semiconductor Manufacturing Co., Ltd., Hsin-Chu (TW)

(72) Inventors: Yu-Hsing Chang, Taipei (TW); Ming Chyi Liu, Hsinchu (TW); Shih-Chang Liu, Alian Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/032,362

(22) Filed: Sep. 25, 2020

(65) Prior Publication Data

US 2022/0102155 A1    Mar. 31, 2022

(51) Int. Cl.
*H01L 21/3065* (2006.01)
*H01L 21/308* (2006.01)
*H01L 49/02* (2006.01)

(52) U.S. Cl.
CPC ...... *H01L 21/30655* (2013.01); *H01L 21/308* (2013.01); *H01L 28/90* (2013.01)

(58) Field of Classification Search
None
See application file for complete search history.

(56) References Cited

U.S. PATENT DOCUMENTS

| | | | |
|---|---|---|---|
| 5,501,893 A | 3/1996 | Laermer et al. | |
| 6,531,068 B2 | 3/2003 | Laermer et al. | |
| 6,649,477 B2 | 11/2003 | Blanchard et al. | |
| 6,924,235 B2 | 8/2005 | Johnson et al. | |
| 8,273,663 B2 * | 9/2012 | Smith | H01L 33/20 438/700 |
| 9,054,050 B2 * | 6/2015 | LeFevre | H01L 21/30655 |
| 9,385,318 B1 * | 7/2016 | Henri | H01L 45/1233 |
| 9,543,148 B1 * | 1/2017 | Hudson | H01L 21/67069 |
| 10,529,578 B2 * | 1/2020 | Meng | B81C 1/00531 |
| 10,811,274 B2 * | 10/2020 | Katsunuma | H01L 21/31116 |
| 10,886,140 B2 * | 1/2021 | Jiang | H01L 21/02112 |
| 11,121,027 B2 * | 9/2021 | Lu | H01L 21/0228 |
| 2005/0136682 A1 * | 6/2005 | Hudson | H01L 21/31116 438/714 |

(Continued)

FOREIGN PATENT DOCUMENTS

| | | |
|---|---|---|
| CN | 111446167 A | 7/2020 |
| WO | 2020178431 A1 | 9/2020 |

*Primary Examiner* — Allan W. Olsen
(74) *Attorney, Agent, or Firm* — Eschweiler & Potashnik, LLC

(57) ABSTRACT

In some methods, a first recess is etched in a selected region of a substrate. A first polymer liner is formed on sidewalls and a bottom surface of the first recess. A portion of the first polymer liner is removed from the bottom surface, and a remaining portion of the first polymer liner is left along the sidewalls. The first recess is deepened to establish a second recess while the remaining portion of the first polymer liner is left along the sidewalls. A first oxide liner is formed along the sidewalls and along sidewalls and a bottom surface of the second recess. A portion of the first oxide liner is removed from a bottom surface of the second recess, while a remaining portion of the first oxide liner is left on the sidewalls of the first recess and the sidewalls of the second recess.

20 Claims, 8 Drawing Sheets

(56) References Cited

U.S. PATENT DOCUMENTS

| | | | |
|---|---|---|---|
| 2006/0223324 A1* | 10/2006 | Ikegami | H01L 21/02057 438/700 |
| 2008/0286978 A1* | 11/2008 | Chen | H01L 21/30655 438/713 |
| 2009/0275202 A1* | 11/2009 | Tanaka | H01L 21/02271 700/121 |
| 2011/0168908 A1 | 7/2011 | Wang et al. | |
| 2012/0129278 A1 | 5/2012 | Yoshii et al. | |
| 2013/0051530 A1 | 2/2013 | Nepomnishy et al. | |
| 2014/0295668 A1* | 10/2014 | Avasarala | H01L 21/31144 438/696 |
| 2015/0069581 A1 | 3/2015 | Chang et al. | |
| 2017/0178920 A1* | 6/2017 | Dole | H01J 37/32137 |

* cited by examiner

HIGH ASPECT RATIO BOSCH DEEP ETCH

BACKGROUND

The rapidly expanding microelectrical mechanical systems (MEMS) market and other areas of semiconductor processing can utilize etching techniques to achieve deep trenches in silicon substrates. For example, some microfluidic devices, chemical, biological and optical transducers can benefit from having deep, high aspect ratio trenches with extremely smooth sidewalls. Decoupling capacitors, Dynamic Random Access Memory (DRAM), and/or Complementary Metal Oxide Semiconductor (CMOS) devices, among others, are also applications where deep trench etching can be advantageous.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
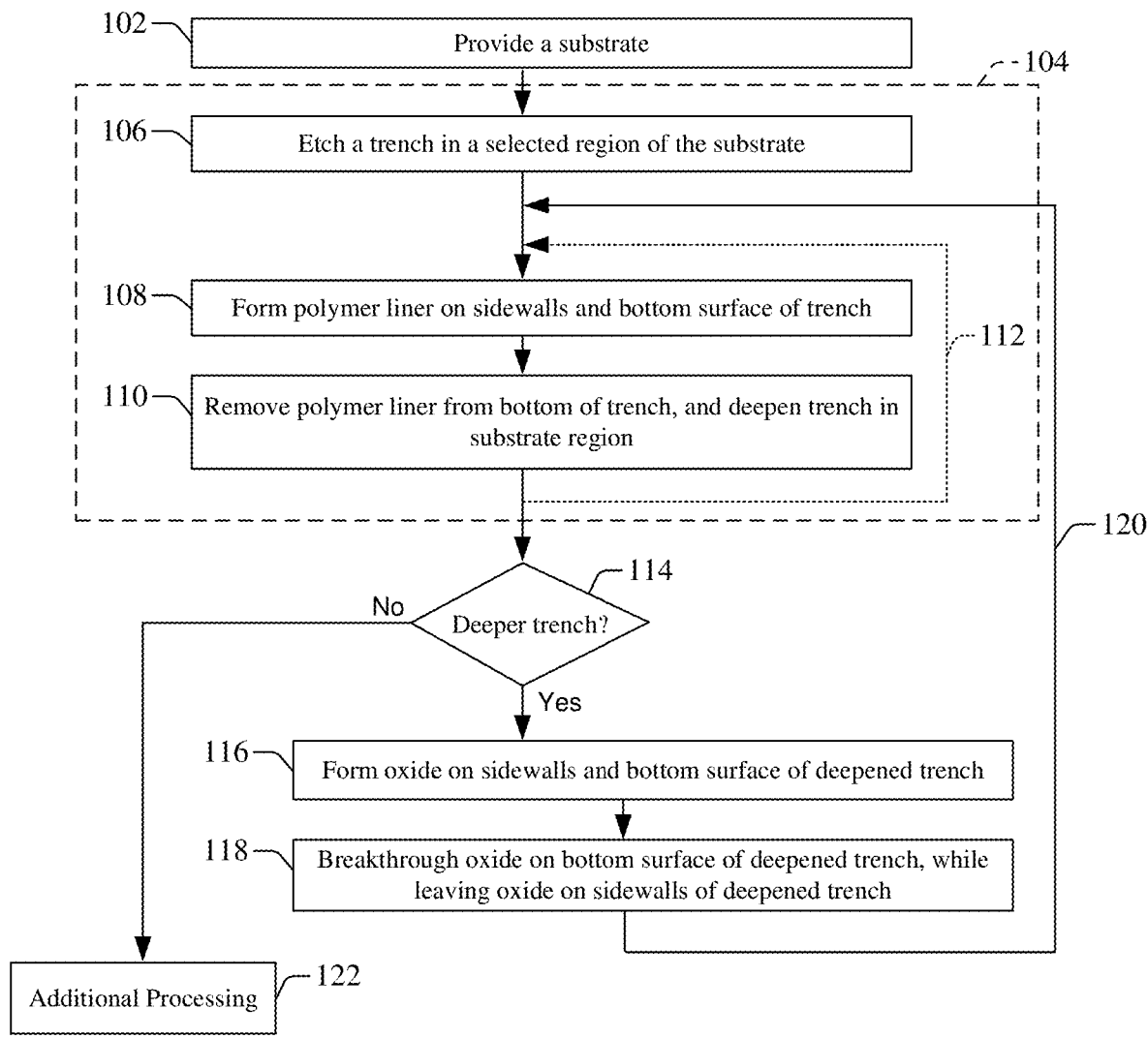
FIG. 1 shows a methodology in flowchart format of a method of forming a deep, high aspect ratio trench in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Although the term "trench" is traditionally used to define a long, narrow ditch, the term "trench" as used in this disclosure is not limited to a long, narrow, ditch, but is to be construed broadly to include rectangular holes that are not so long and narrow, square holes, circular or rounded holes, or even holes with meandering or polygonal geometries, any and all of which are contemplated as being a "trench" for purposes of this disclosure.

The Bosch process is one process traditionally used for deep silicon etching, and is carried out by using alternating deposition and etching cycles. Although useful in many applications, traditional Bosch processes encounter increased lateral etching at top regions of the trench, whereas bottom regions of the trench have less lateral etching. The present disclosure includes an oxidation operation at various stages of a Bosch process to reduce the lateral etching at top regions of the trench, thereby providing trenches with higher aspect ratios that previous approaches.

To set forth some embodiments, FIG. 1 illustrates a somewhat general manufacturing method in flowchart format while FIGS. 2-17 collectively illustrate a more detailed manufacturing method as a series of cross-sectional views. It will be appreciated that although this method and/or others illustrated and/or described herein illustrate and/or describe a number of acts, not all of these acts are necessarily required, and other un-illustrated acts may also be present. Also, the ordering of the acts in some embodiments can vary from what is illustrated in the figures. In addition, the illustrated acts can be further divided into sub-acts in some implementations, while in other implementations some of the illustrated acts can be carried out concurrently with one another.

FIG. 1's method 100 starts at 102 when a substrate is provided. In 104, a Bosch process includes alternating deposition and etching cycles to form a trench in a selected region of the substrate. Thus, in 106, an etch process is carried out to form a trench in the selected region of the substrate. In 108, after the etch process has formed the trench, a formation process is used to form a polymer liner on sidewalls of the trench and on a bottom surface of the trench. In 110, the polymer liner is removed from the bottom surface of the trench but is left in place on the sidewalls of the trench, and an etch is used to extend the depth of the trench. The etch process and formation of the polymer liner can be carried out in successive cycles (e.g., repeated as shown by 112) until a first desired trench depth is reached and/or until a predetermined number of Bosch etch cycles is carried out. If a still deeper trench is desired ("YES" at 114), an oxide is formed on sidewalls and a bottom surface of the trench in 116. Then, in 118, an etch is used to break through the oxide on the bottom surface of the trench while the oxide is left on the sidewalls of the trench. With the oxide in place on sidewalls of the deepened trench, as shown by 120 the method returns to 108 and a polymer liner is formed on sidewalls of the trench. At this point, the polymer liner is formed along inner sidewalls of the oxide lining the trench sidewalls. The polymer liner is then removed from the bottom surface of the trench in 110, and the trench is again extended deeper into the substrate at 110. Again, the etch process and formation of the polymer liner can be carried out in successive cycles (e.g., repeated as shown by 112) until a second desired trench depth is reached and/or until a predetermined number of cycles is carried out. The method continues in this manner until a total desired depth is reached for the trench (e.g., "No" at 114), and the method can move onto additional processing in 122.

By inserting an oxidation operation into a Bosch process, the method can reduce the lateral etching at top regions of the trench, thereby providing trenches with higher aspect ratios than previous approaches. Such an approach may be useful in many applications, such as in decoupling capacitors, MEMS devices, CMOS devices, and DRAM, among others.

Turning now to FIGS. 2-17, one can see a series of cross-sectional views that collectively depict a method of forming a deep, high aspect ratio trench in accordance with some embodiments.

Figure 2:
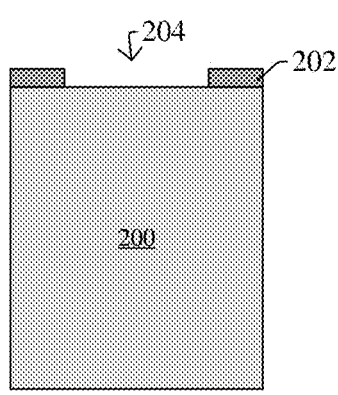
FIGS. 2-17 show a series of cross-sectional diagrams that collectively illustrate a method of forming a deep, high aspect ratio trench in accordance with some embodiments.

FIG. 2 illustrates a substrate 200 and can be consistent with some embodiments of FIG. 1, 102. It will be appreciated that "substrate" as referred to herein may comprise any type of substrate, and typically is a semiconductor substrate such as a bulk monocrystalline silicon wafer, a binary compound substrate (e.g., GaAs wafer), a ternary compound substrate (e.g., AlGaAs), or a higher order compound wafer, with or without additional insulating or conducting layers formed thereover, among others. When a semiconductor substrate is used, it can also include non-semiconductor materials such as oxide in silicon-on-insulator (SOI), partial SOI substrate, polysilicon, insulator, oxide, metal, amorphous silicon, or organic material, among others. In some embodiments, the substrate 200 can also include multiple wafers or dies which are stacked or otherwise adhered together. The substrate 200 can include wafers which are cut from a silicon ingot, and/or any other type of semiconductor/non-semiconductor and/or deposited or grown (e.g. epitaxial) layers formed on an underlying substrate.

As can be seen in FIG. 2, a mask layer 202 has been formed and patterned over the substrate 200. For example, the mask layer 202 can include a patterned photoresist layer, a patterned nitride layer, a patterned oxide layer, and/or another type of hard mask that is relatively impervious to etching during subsequent Bosch etch cycles to be carried out. In some embodiments where the mask layer 202 includes a photoresist layer, the photoresist layer is generally applied as a liquid (e.g., spun on) to the upper surface of the substrate 200, and is then baked to solidify. After the photoresist layer is baked, a photomask or reticle is positioned over the photoresist layer, and light is passed through the photomask or reticle to selectively expose some regions of the photoresist layer while leaving other regions unexposed. The photoresist layer is then developed, which removes either the exposed regions or unexposed regions (depending on whether the photoresist is positive photoresist or negative photoresist), thereby leaving the mask layer 202 with one or more openings 204 that correspond to a selected region of the substrate.

Figure 3:
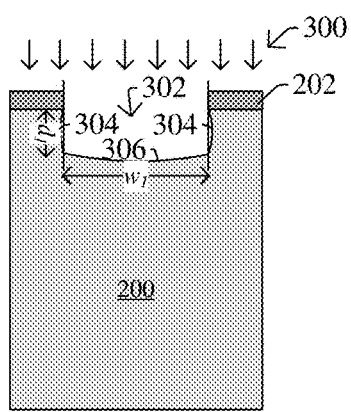
Figure 4:
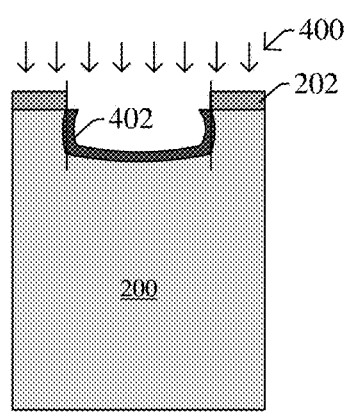
Figure 5:
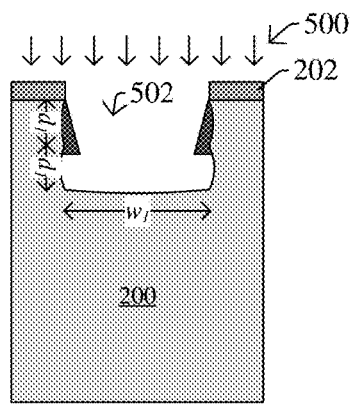

FIGS. 3-5, which are described in more detail below, show a Bosch process that can be consistent with some embodiments of FIG. 1, 104. The Bosch process results in a trench in the substrate (see trench 502, FIG. 5), and includes series of etch operations (FIG. 3, FIG. 5) and a deposition operation (FIG. 4) that generally alternate with one another for each etch cycle of the Bosch process.

More particularly, the Bosch process starts in FIG. 3, which can be consistent with some embodiments of FIG. 1, 106. In FIG. 3, a plasma 300, such as a fluorine-based plasma, is used to etch a first recess 302 into the substrate 200. In forming the first recess 302, the fluorine-based plasma 300 carves out rounded sidewalls 304 that are scalloped in shape as well as a rounded bottom surface 306. In some embodiments, a depth, $d_1$, of the first recess 302 can range from approximately 0.01 um to approximately 1 um, and a width, $w_1$, of the first recess can range from approximately 0.1 um to approximately 1000 um. In some embodiments, $SF_6$ gas can be used for this etch, using a gas flow rate of between 10~1000 sccm, a process pressure of between approximately 5 mTorr and 500 mTorr, and a plasma power of 100 watts to approximately 5000 watts, for an etch time of 0.1 sec to 10 sec.

The Bosch process continues in FIG. 4, which can be consistent with some embodiments of FIG. 1, 108. In FIG. 4, a fluorocarbon-based plasma 400, such as a plasma based on octo-fluorocyclobutane (c-$C_4F_8$) for example, is used to form a first polymer liner 402 on sidewalls of the first recess 302. In some embodiments, the first polymer liner 402 can be formed only on the trench sidewalls, and not on bottom trench surface, while in other embodiments such as the illustrated embodiment, the first polymer liner 402 can be formed on the sidewalls and bottom trench surface and then removed from the bottom trench surface prior to the next etching step (see e.g., FIG. 5). The first polymer liner 402 can be composed of C, F, Si, and/or O, and can have a thickness ranging from approximately 10 angstroms to approximately 300 angstroms. In some embodiments, $C_4F_8$ gas can be used to form the first polymer liner 402, using a gas flow rate of between 10-1000 sccm, a process pressure of between approximately 5 mTorr and 500 mTorr, and a plasma power of 100 watts to approximately 5000 watts, for a deposition time of 0.1 sec to 10 sec.

FIG. 5 depicts an etching process that can be consistent with some embodiments of FIG. 1, 110. In FIG. 5, fluorine-based plasma 500 is used to etch a second recess 502 into the substrate 200. Like the first recess 302, the second recess 502 has rounded sidewalls that are scalloped in shape as well as a rounded bottom surface. Typically the fluorine-based plasma 500 used to form the second recess 502 is the same as the fluorine-based plasma 300 used to form the first recess 302. This helps to ensure the width of the first and second recesses are approximately the same and promotes "vertical" trench sidewalls or nearly vertical trench sidewalls. However, if the resultant trench is to be v-shaped, undulating, or have some other sidewall surface geometry, the plasma conditions for 300, 500 can also be different. In some embodiments, $SF_6$ gas can be used for this etch, using a gas flow rate of between 10-1000 sccm, a process pressure of between approximately 5 mTorr and 500 mTorr, and a plasma power of 100 watts to approximately 5000 watts, for an etch time of 0.1 sec to 10 sec. The fluorine-based plasma 500 can also "thin" the top sidewall regions of the polymer liner 402 to leave thinner upper sidewalls and thicker lower sidewalls.

Figure 6:
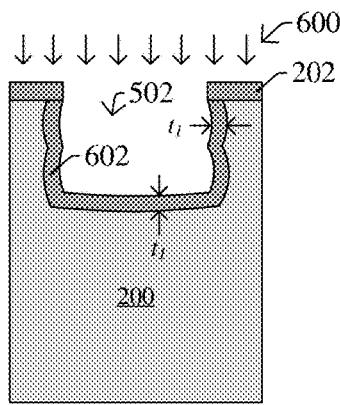

FIG. 6 depicts an oxidation process that can be consistent with some embodiments of FIG. 1, 116. In FIG. 6, the remaining polymer liner is removed, and a first oxidation process 600 is carried out to form a first oxide layer 602 along sidewalls and a bottom surface of the second recess 502. In some embodiments, the first oxidation process 600 is a thermal oxidation process, for example, carried out in a furnace, such that the first oxide layer 602 comprises silicon dioxide. In other embodiments, the first oxidation process 600 can take other forms, such as chemical vapor deposition (CVD), physical vapor deposition (PVD), or atomic layer deposition (ALD) for example. In other embodiments, rather than an oxide, layer 602 can alternatively comprise a nitride, such as silicon nitride or silicon oxynitride, or a carbide, such as silicon carbide, among others.

Figure 7:
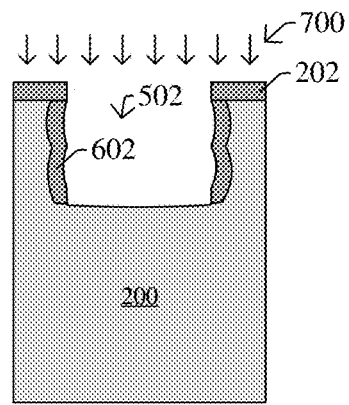

FIG. 7 depicts an etch process that can be consistent with some embodiments of FIG. 1, 118. In FIG. 7, an etch 700 is carried out to remove a portion of the first oxide layer 602 from the bottom surface of the second recess 502 and to leave a remaining portion of the first oxide layer 602 in place along sidewalls of the second recess 502. The etch 700 is typically an isotropic etch that is strongly vertical, such as a dry etch and/or highly directional plasma etch.

Figure 8:
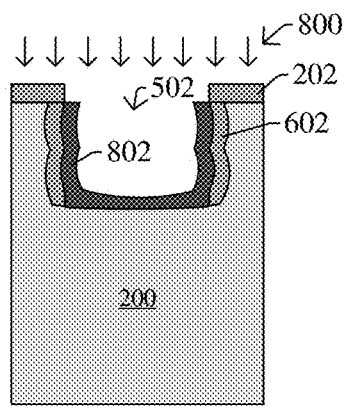

FIG. 8 depicts a formation process 800 that can be consistent with some embodiments of FIG. 1, 108 after 120. In FIG. 8 a fluorocarbon-based plasma, such as a plasma based on octo-fluorocyclobutane (c-$C_4F_8$) for example, is used to form a second polymer liner 802 on sidewalls of the second recess 502. Typically the fluorocarbon-based plasma 800 is the same as fluorocarbon-based plasma 400. The second polymer liner 802 extends along inner sidewalls of the first oxide layer 602 and on a bottom surface of the second recess 502.

Figure 9:
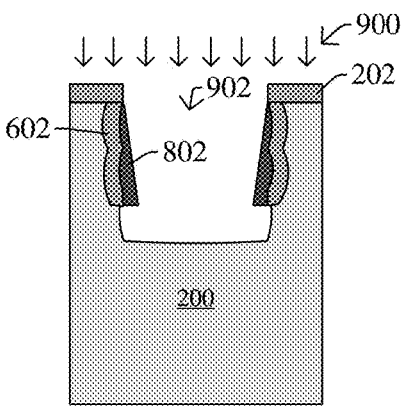

FIG. 9 depicts a formation process that can be consistent with some embodiments of FIG. 1, 110 after 120. In FIG. 9, a third recess 902 has been etched, for example by using a fluorine-based plasma 900. Like the first recess 302 and second recess 502, the third recess 902 has rounded sidewalls that are scalloped in shape as well as a rounded bottom surface. Typically, the fluorine-based plasma 900 used to form the third recess 902 is the same as the fluorine-based plasma 300 used to form the first recess 302 and/or is the same as the fluorine-based plasma 500 used to form the second recess 502. In some embodiments, $SF_6$ gas can be used for this etch, using a gas flow rate of between 10-1000 sccm, a process pressure of between approximately 5 mTorr and 500 mTorr, and a plasma power of 100 watts to approximately 5000 watts, for an etch time of 0.1 sec to 10 sec. The fluorine-based plasma 900 can also "thin" the top sidewall regions of the second polymer liner 802 to leave thinner upper sidewalls and thicker lower sidewalls.

Figure 10:
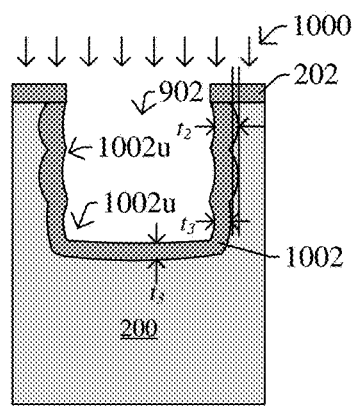

FIG. 10 depicts an etch process that can be consistent with some embodiments of FIG. 1, 116 after 120. In FIG. 10, after the remaining second polymer liner 802 has been removed, and a second oxidation process 1000 is carried out to form a second oxide layer 1002 along sidewalls and a bottom surface of the third recess 902. In some embodiments, the upper regions of the second oxidation layer (1002*u*) have a second thickness, $t_2$, that is greater than the first thickness $t_1$ (see FIG. 6). The bottom regions of the second oxidation layer (1002*l*), which are newly in place, have a third thickness, $t_3$. The third thickness, $t_3$, can be less than the second thickness, $t_2$, and in some cases the third thickness, $t_3$, can be equal to the first thickness, $t_1$. For example, if the second oxidation process 1000 is a thermal oxidation, the upper regions of the second oxidation layer 1000*u* may have a second thickness $t_2$ that is no more than 50% greater than the third thickness $t_3$ of the lower regions of the oxidation layer 1000*l*. This is because oxide growth for thermal oxidation slows as the oxide becomes thicker, so the upper regions 1002*u* (which already have oxide in place) have slower oxidation rates than the lower regions 1002*l* (which have minimal or no oxide in place prior to the second oxidation process).

Figure 11:
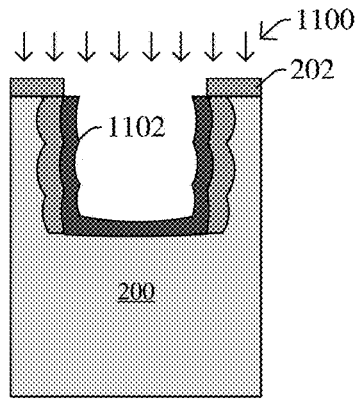
Figure 12:
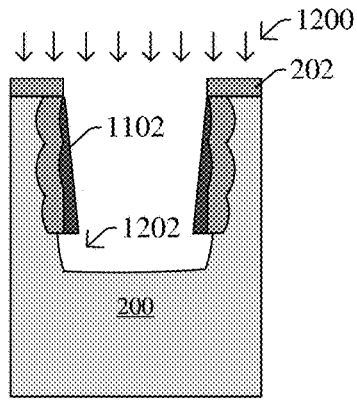
Figure 13:
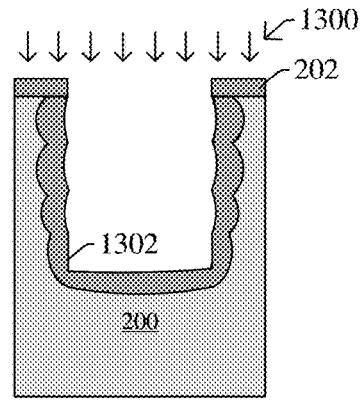
Figure 14:
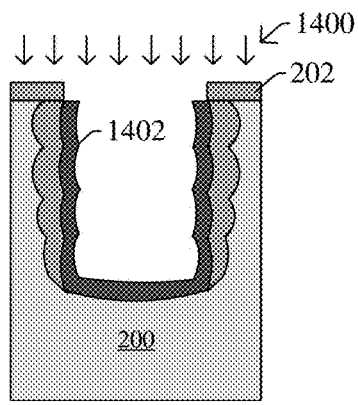
Figure 15:
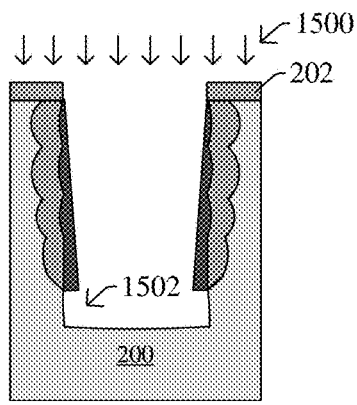
Figure 16:
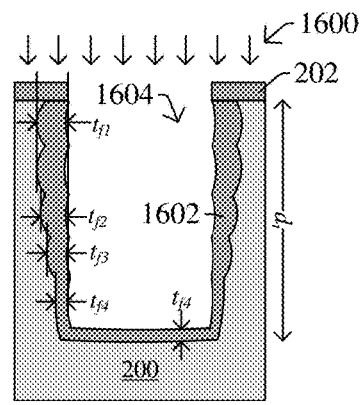

In FIGS. 11-16, deposition processes (FIG. 11, FIG. 14), etching processes (FIG. 12, FIG. 15), and oxidation processes (FIG. 13, FIG. 16) are repeatedly cycled until the trench 1604 reaches the desired total depth, $d_t$, for example as shown in FIG. 16. Thus, FIG. 11 shows a formation process 1100 (which can be the same as FIG. 4, 400 and/or FIG. 8, 800) that forms a third polymer liner 1102; FIG. 12 shows an etch process 1200 (which can be the same as FIG. 5, 500 and/or FIG. 9, 900) that forms a fourth recess 1202; FIG. 13 shows an oxidation process 1300 (which can be the same as FIG. 6, 600 and/or FIG. 10, 1000) that forms a third oxide layer 1302, FIG. 14 shows a formation process 1400 (which can be the same as FIG. 4, 400; FIG. 8, 800; and or FIG. 11, 1100) that forms a fourth polymer liner 1402, FIG. 15 shows an etch process 1500 (which can be the same as FIG. 5, 500, FIG. 9, 900, and/or FIG. 12, 1200) that forms a fifth recess 1502; and FIG. 16 shows an oxidation process 1600 (which can be the same as FIG. 6, 600; FIG. 10, 1000; and/or FIG. 13, 1300). As shown in FIG. 16, when the total number of etch cycles reaches a predetermined number and/or when the total trench depth reaches a desired total depth, $d_t$, trench 1604 can be complete and trench etching process stops, and additional processing can be performed.

In FIG. 16, the final oxide layer 1602 can have varying thicknesses along the sidewalls of the trench at different depths. These thicknesses can "step down" at discrete increments as the depth of the trench 1604 increases. For example, in cases where the oxide layer 1602 is formed by successive thermal oxidations, the first (e.g., uppermost) sidewall regions of the oxide layer 1602 can exhibit a first final thickness, $t_{f1}$; second (e.g., middle-upper) sidewall regions of the oxide layer 1602 can exhibit a second final thickness, $t_{f2}$ (where $t_{f2} < t_{f1}$); third (e.g., middle-lower) sidewall regions of the oxide layer 1602 can exhibit a third final thickness, $t_{f3}$ (where $t_{f3} < t_{f2}$); and fourth (e.g., lowermost) sidewall regions and the bottom surface of the oxide layer 1602 can exhibit a fourth final thickness, $t_{f4}$ (where $t_{f4} < t_{f3}$). Moreover, the first final thickness, $t_{f1}$, remains constant over one or more upper scallops, then discretely changes to the second final thickness, $t_{f2}$, which then remains constant over one or more middle-upper scallops. The second final thickness, $t_{f2}$, then discretely changes to the third final thickness, $t_{f3}$, which remains constant over one or more lower-middle scallops; and the third final thickness, $t_{f3}$, then discretely changes to the fourth final thickness, $t_{f4}$, which remains constant over one or more lowermost scallops and over the bottom surface of the final trench.

Although FIG. 16 has been described with regards to four thicknesses, more than four or fewer than four thicknesses can be present, depending on how many oxidation cycles are performed over the depth of the trench, but generally thicknesses of the oxide layer 1602 "step down" in discrete increments as one proceeds deeper into the trench. In some cases, such as when the oxide layer 1602 is formed by successive thermal oxidations, a first difference between the first final thickness, $t_{f1}$, and the second final thickness, $t_{f2}$, is less than a second difference between the second final thickness, $t_{f2}$, and the third final thickness, $t_{f3}$, and the second difference is less than a third difference between the third final thickness, $t_{f3}$ and the fourth final thickness, $t_{f4}$, and so on. In other cases, such as when the oxide layer 1602 is formed by CVD, PVD, or ALD, for example, a difference between the first final thickness, $t_{f1}$, and the second final thickness, $t_{f2}$, is equal to a difference between the second final thickness, $t_{f2}$, and the third final thickness, $t_{f3}$, and so on; but the difference between the first final thickness, $t_{f1}$, and the second final thickness, $t_{f2}$, could also be greater than or less than the difference between the second final thickness, $t_{f2}$, and the third final thickness, $t_{f3}$, in some instances.

As viewed from above, the trench 1604 can have one of several different configurations. In some embodiments the trench can be rectangular as viewed from above and can have a width of approximately 2 μm to approximately 5 μm, and a depth of approximately 30 μm. In other embodiments, the trenches can be substantially circular as viewed from above and can have a radius of approximately 50 μm and a depth of approximately 150 μm. The trenches can have a nearly vertical sidewall angle, which is measured relative to an upper substrate surface, where nearly vertical means that the sidewalls meet the upper substrate surface at an angle of 90-degrees, plus or minus 3 degrees. In some embodiments, the trench 1604 can have a depth:width aspect ratio ranging from of approximately 3:1 to approximately 100:1, for example.

Figure 17:
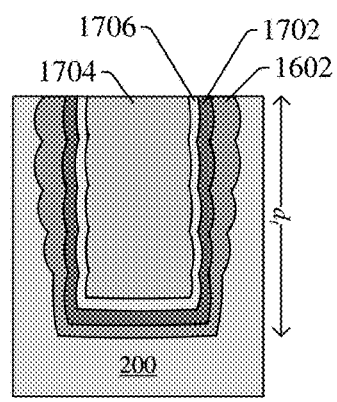

In FIG. 17, additional processing can be performed (see e.g., FIG. 1, 122). For example, alternating conductive layers (e.g., 1702, 1704) and insulating layers (e.g., 1706) can be conformally formed along the trench sidewalls and bottom surface to build-up a capacitor structure in the trench. The conductive layers can comprise a metal, or polysilicon for example, and the insulating layers can comprise silicon dioxide or a high-k dielectric material.

It will be appreciated that the conditions for the etching, deposition, and oxidation processes used in FIGS. 3-17 can vary widely depending on the desired etch rate, aspect ratio, and sidewall smoothness desired. Generally, etch processes with shorter duration for each cycle result in a slower etch but with smaller sidewall scallops, while etch processes with longer duration for each cycle result in a faster etch but with larger sidewall scallops. The endpoint for the Bosch process can occur when the number of cycles reaches a predetermined number at which the desired trench depth, $d_t$, is expected to be reached, or can occur by performing real-time monitoring of the trench depth and stopping the process when measurement indicates the desired trench depth is reached.

Due to the use of the oxidation process (e.g., FIGS. 6, 10, 13, and 16), the resultant trench 1604 can exhibit less variation in trench width as measured between sidewalls at the top of the trench and sidewalls at the bottom of the trench. More particularly, compared to conventional approaches where the top of the trench had wider sidewalls than the bottom of the trench (e.g., due to more lateral etching at the top of the trench), some aspects of the present disclosure provide sidewalls that are more uniform in trench width at the top of the trench and the bottom of the trench.

Figure 18:
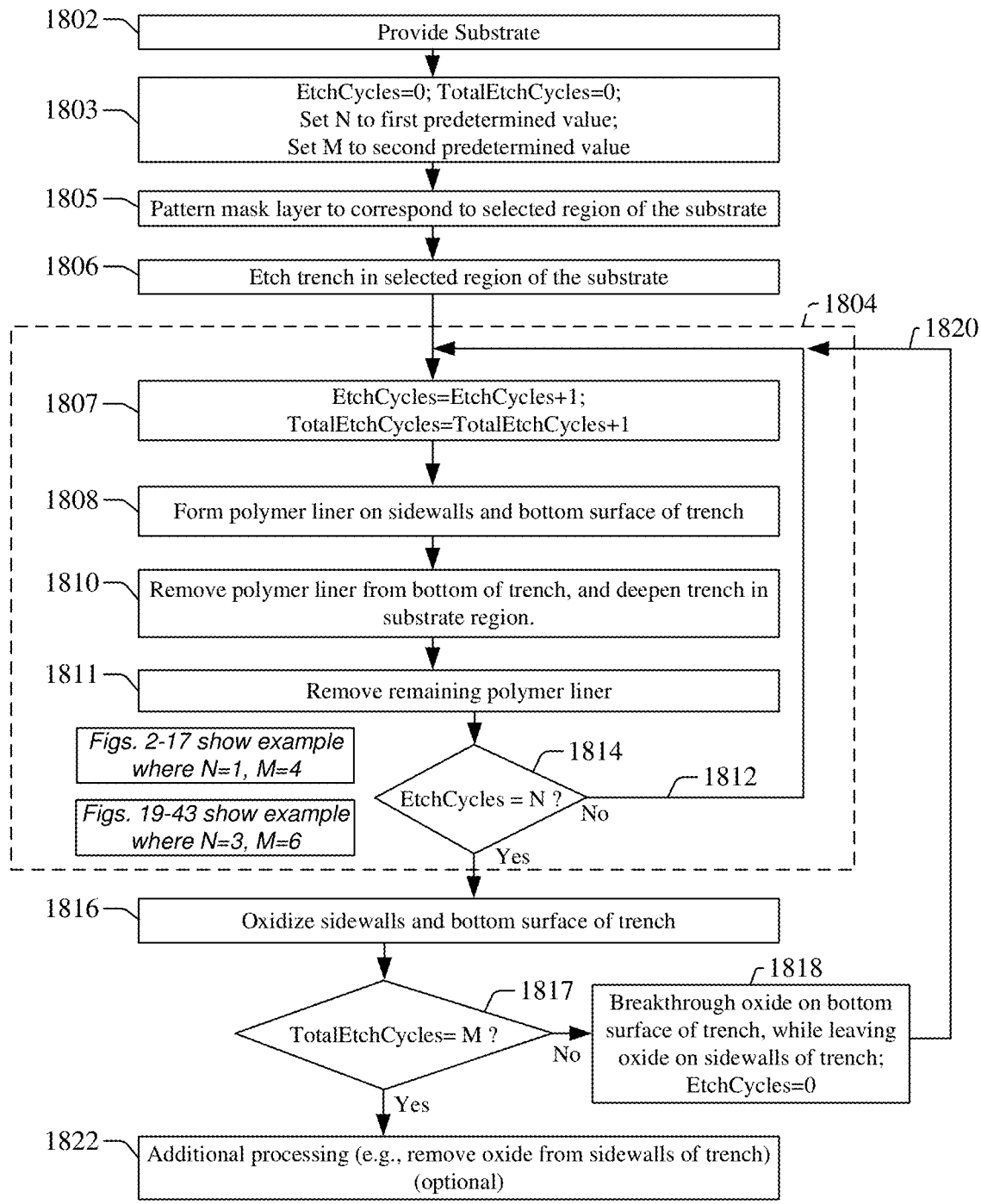
FIG. 18 shows a methodology in flowchart format of a method of forming a deep, high aspect ratio trench in accordance with some embodiments.

FIG. 18 illustrates an example of another method 1800 in accordance with some aspects of this disclosure. As will be appreciated further below, this method 1800 is flexible and allows for the oxidation process to be carried out at less than all of the Bosch etch/deposition cycles. Because of this flexibility, the process can be tailored to use fewer oxidations (e.g., one oxidation for every one-hundred etch/deposition cycles), thereby promoting faster etches that exhibit slightly more variation in trench width between the top of the trench and bottom of the trench; or can be tailored to use more oxidations (e.g., one oxidation for each etch/deposition cycle), thereby providing slower etches that exhibit slightly less variation in trench width between the top of the trench and bottom of the trench.

The method 1800 starts at 1802 when a substrate is provided.

In 1803, variables "EtchCycle" and "TotalEtchCycles" are initialized to a predetermined value (e.g., zero), variable N is set to a first predetermined value and variable M is set to a second predetermined value that can be the same or different from N.

Briefly, in 1804 one or more Bosch etch cycles are carried out in to form a trench in a selected region of the substrate. The number of Bosch etch cycles is carried out until N etch cycles are reached in 1814. Then, in 1816, after the N Bosch etch cycles are carried out to form the trench, an oxidation process is carried out to oxidize sidewalls and a bottom surface of the trench. If a number of total etch cycles remains less than M (and/or if a predetermined trench depth is not yet met) ("NO" at 1817), oxide regions can be removed from the bottom of the trench and additional Bosch etch cycles can be carried out (1818 and 1820). Alternatively, if the total number of etch cycles reaches M (and/or if a predetermined trench depth is met) ("YES" at 1817), then the etching process is complete and additional processing can be performed. It will be appreciated that FIGS. 2-17 illustrated an example where N=1 and M=4, and FIGS. 19-43 illustrate an example where N=3 and M=6, but in general N and M can take any values.

More particularly, in 1805, a mask layer is patterned to correspond to a selected region of the substrate.

In 1806, an etch process, such as a $SF_6$ plasma etch for example, is carried out to form a trench in the selected region of the substrate.

In 1807, the variables TotalEtchCycles and EtcCycles are each incremented.

In 1808, after the etch process has formed the trench, a process, such as a $C_4F_8$ plasma, is used to form a polymer liner on sidewalls of the trench and on a bottom surface of the trench.

In 1810, the polymer liner is removed from the bottom of the trench but is left in place on the sidewalls of the trench, and an etch, such as a $SF_6$ plasma etch for example, is used to extend the depth of the trench. In some embodiments, act 1810 thins the polymer liner on sidewalls of trench so the polymer liner is thinner near the top of the trench and is thicker near the bottom of the trench.

After the trench is deepened, remaining portions of the polymer liner are removed in 1811.

As shown by 1812, the etch process and formation of the polymer liner can be carried out in successive cycles (e.g., repeated) until a predetermined number (N) of etch cycles is carried out (and/or until a first desired trench depth is reached).

If a still deeper trench is desired ("YES" at 1814), sidewalls and a bottom surface of the extended trench are oxidized in 1816.

In 1818, if the current number of TotalEtchCycles is not yet a predetermined number, M ("NO" at 1817), the method proceeds to 1818 where an etch is used to break through the oxide on the bottom surface of the trench while the oxide is left on the sidewalls of the trench. With the oxide in place on the sidewalls, the method returns to 1807 where the variables TotalEtchCycles and EtcCycles are each incremented, and a polymer liner is again formed on sidewalls of the trench in 1808. At this point, the polymer liner is formed along inner sidewalls of the oxide lining the trench sidewalls. The polymer liner is then removed from the bottom surface of the trench in 1810, and the trench is again extended deeper into the substrate at 1810. Again, etch process and formation of the polymer liner can be carried out in successive cycles (e.g., repeated as shown by 1812) until a second desired trench depth is reached and/or until a predetermined number of etch cycles, N, is carried out (e.g., "YES" at 1814). The method continues in this manner until the predetermined total number of etch cycles, M, is reached (and/or a desired depth is reached for the trench) (e.g., "YES" at 1817), and the method can move onto additional processing in 1822.

Turning now to FIGS. 19-43, one can see a series of cross-sectional views that collectively depict a method of forming a deep, high aspect ratio trench in accordance with some embodiments.

Figure 19:
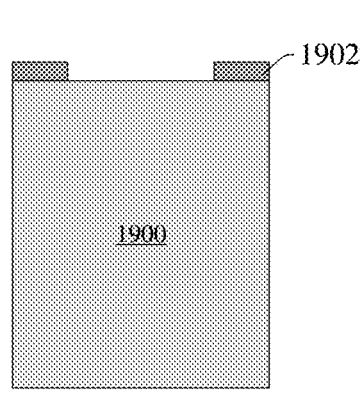
FIGS. 19-43 show a series of cross-sectional diagrams that collectively illustrate a method of forming a deep, high aspect ratio trench in accordance with some embodiments.

FIG. 19 illustrates a substrate 1900, and is consistent with some embodiments of FIGS. 18, 1802 and 1805. As can be seen in FIG. 19, a mask layer 1902 has been formed and patterned over the substrate 1900. For example, the mask layer 1902 can include a patterned photoresist layer, a patterned nitride layer, a patterned oxide layer, and/or another type of hard mask that is relatively impervious to etching during subsequent Bosch etch cycles to be carried out. In some embodiments where the mask layer 1902 includes a photoresist layer, the photoresist layer is generally applied as a liquid (e.g., spun on) to the upper surface of the substrate 1900, and is then baked to solidify. After the photoresist layer is baked, a photomask or reticle is positioned over the photoresist layer, and light is passed through the photomask or reticle to selectively expose some regions of the photoresist layer while leaving other regions unexposed. The photoresist layer is then developed, which removes either the exposed regions or unexposed regions (depending on whether the photoresist is positive photoresist or negative photoresist), thereby leaving the mask layer 1902.

Figure 20:
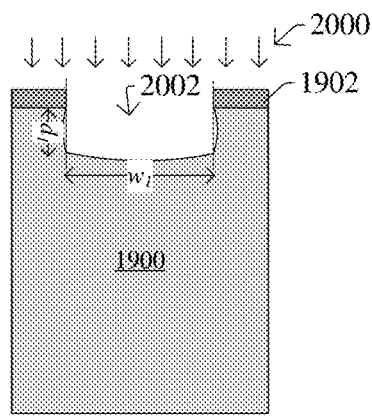

In FIG. 20, which can correspond to some embodiments of FIG. 18, 1806, a plasma 2000, such as a fluorine-based plasma, is used to etch a first recess 2002 into the substrate 1900. In forming the first recess 2002, the fluorine-based plasma 2000 carves out rounded sidewalls that are scalloped in shape as well as a rounded bottom surface. In some embodiments, a depth, $d_1$, of the first recess 2002 can range from approximately 0.01 um to approximately 1 um, and a width, $w_1$, of the first recess can range from approximately 0.1 um to approximately 1000 um. In some embodiments, $SF_6$ gas can be used for this etch, using a gas flow rate of between 10-1000 sccm, a process pressure of between approximately 5 mTorr and 500 mTorr, and a plasma power of 100 watts to approximately 5000 watts, for an etch time of 0.1 sec to 10 sec.

FIGS. 21-32 show several etch cycles of a Bosch process that is consistent with some embodiments of FIG. 18, 1804. The Bosch process results in a trench in the substrate (see trench 3202, FIG. 32), and includes series of deposition operations (FIG. 21, FIG. 25, FIG. 29), and a series of etch operations (FIGS. 22-23, FIGS. 26-27, FIGS. 30-31) that generally alternate with one another for each etch cycle of the Bosch process.

Figure 21:
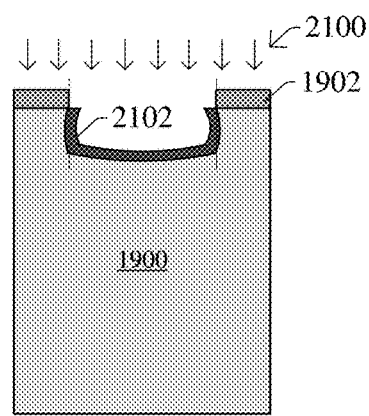

More particularly, FIG. 21 corresponds to some embodiments of FIG. 18, 1808. In FIG. 21, a fluorocarbon-based plasma 2100, such as a plasma based on octo-fluorocyclobutane (c-$C_4F_8$) for example, is used to form a first polymer liner 2102 on sidewalls of the first recess 2002. In some embodiments, the first polymer liner 2102 can be formed on the sidewalls and on a bottom surface of the first recess 2002. The first polymer liner 2102 can be composed of C, F, Si, and/or O, and can have a thickness ranging from approximately 10 angstroms to approximately 300 angstroms. In some embodiments, $C_4F_8$ gas can be used to form the first polymer liner 2102, using a gas flow rate of between 10-1000 sccm, a process pressure of between approximately 5 mTorr and 500 mTorr, and a plasma power of 100 watts to approximately 5000 watts, for a deposition time of 0.1 sec to 10 sec.

Figure 22:
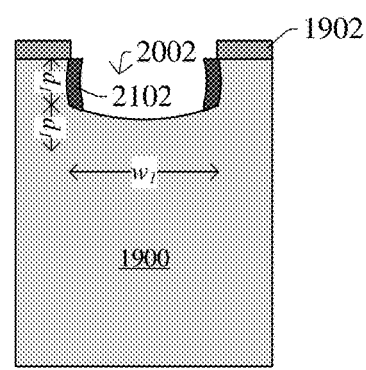
Figure 23:
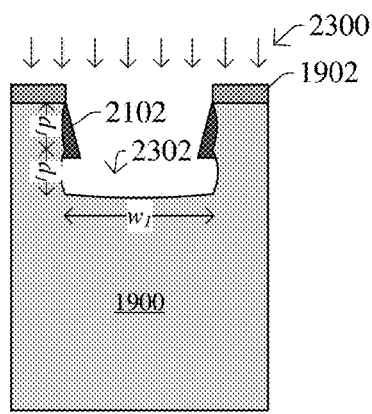

FIGS. 22-23 correspond to some embodiments of FIG. 18, 1810. In FIG. 22, the first polymer liner 2102 is removed from the bottom surface of the first recess, but is left in place on sidewalls of the first recess 2002. In FIG. 23, fluorine-based plasma 2300 is used to etch a second recess 2302 into the substrate 1900. Like the first recess 2002, the second recess 2302 has rounded sidewalls that are scalloped in shape as well as a rounded bottom surface. Typically the fluorine-based plasma 2300 used to form the second recess 2302 is the same as the fluorine-based plasma 2000 used to form the first recess 2002. This helps to ensure the width of the first and second recesses are approximately the same and promotes "vertical" trench sidewalls or nearly vertical trench sidewalls. However, if the resultant trench is to be v-shaped, undulating, or have some other sidewall surface geometry, the plasma conditions for 2000, 2300 can also be different. In some embodiments, $SF_6$ gas can be used for this etch, using a gas flow rate of between 10-1000 sccm, a process pressure of between approximately 5 mTorr and 500 mTorr, and a plasma power of 100 watts to approximately 5000 watts, for an etch time of 0.1 sec to 10 sec. The fluorine-based plasma 2300 can also "thin" the top sidewall regions of the first polymer liner 2102 to leave thinner upper sidewalls and thicker lower sidewalls.

Figure 24:
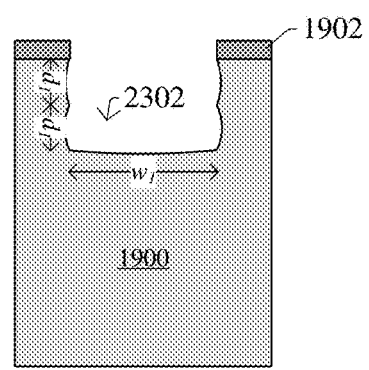

FIG. 24 corresponds to some embodiments of FIG. 18, 1811. In FIG. 24, the remaining first polymer liner is removed.

Figure 25:
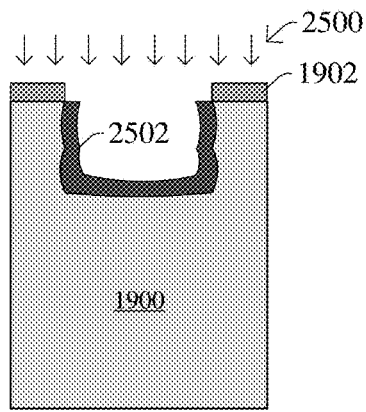

FIG. 25 corresponds to some embodiments of FIG. 18, 1808 (after going through 1812 once). In FIG. 25, a fluorocarbon-based plasma 2500, such as a plasma based on octo-fluorocyclobutane (c-$C_4F_8$) for example, is used to form a second polymer liner 2502 on sidewalls of the second recess 2302. In some embodiments, the second polymer liner 2502 can be formed on the trench sidewalls and on a bottom surface of the second recess. The second polymer liner 2502 can be composed of C, F, Si, and/or O, and can have a thickness ranging from approximately 10 angstroms to approximately 300 angstroms. In some embodiments, $C_4F_8$ gas can be used to form the second polymer liner 2502, using a gas flow rate of between 10-1000 sccm, a process pressure of between approximately 5 mTorr and 500 mTorr, and a plasma power of 100 watts to approximately 5000 watts, for a deposition time of 0.1 sec to 10 sec.

Figure 26:
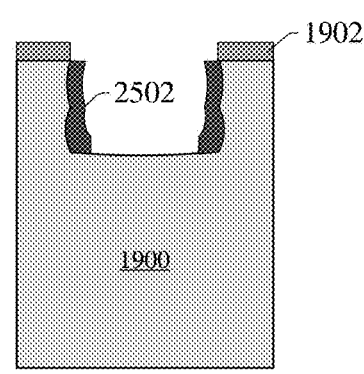
Figure 27:
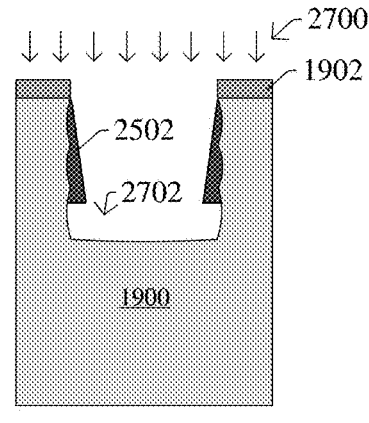

FIGS. 26-27 correspond to some embodiments of FIG. 18, 1810 (after going through 1812 once). In FIG. 26, the second polymer liner 2502 is removed from the bottom surface of the second recess 2302, but is left in place on sidewalls of the second recess. Then, in FIG. 27, a fluorine-based plasma 2700 is used to etch a third recess 2702 into the substrate 1900. Like the first recess 2002 and/or second recess 2302, the third recess 2702 has rounded sidewalls that are scalloped in shape as well as a rounded bottom surface. Typically the fluorine-based plasma 2700 used to form the third recess 2702 is the same as the fluorine-based plasma 2000 and/or 2300. This helps to ensure the width of the first, second, and/or third recesses are approximately the same and promotes "vertical" trench sidewalls or nearly vertical trench sidewalls. However, if the resultant trench is to be v-shaped, undulating, or have some other sidewall surface geometry, the plasma conditions for 2000, 2300, 2700 can also be different. In some embodiments, $SF_6$ gas can be used for this etch, using a gas flow rate of between 10-1000 sccm, a process pressure of between approximately 5 mTorr and 500 mTorr, and a plasma power of 100 watts to approximately 5000 watts, for an etch time of 0.1 sec to 10 sec. The fluorine-based plasma 2700 can also "thin" the top sidewall regions of the second polymer liner 2502 to leave thinner upper sidewalls and thicker lower sidewalls.

Figure 28:
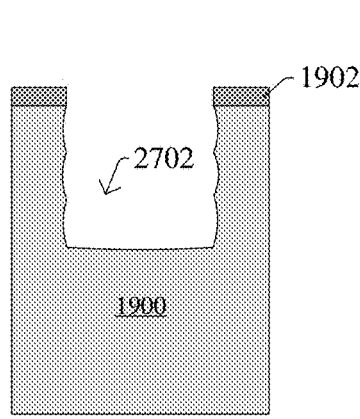

FIG. 28 corresponds to some embodiments of FIG. 18, 1811 (after going through 1812 once). In FIG. 28, the remaining second polymer liner is removed.

Figure 29:
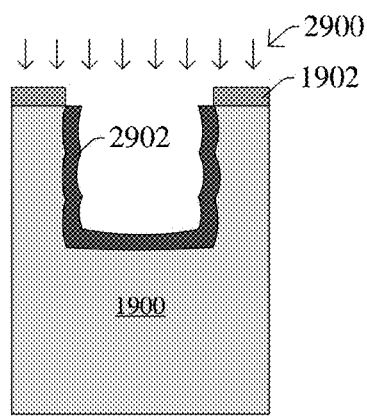

FIG. 29 corresponds to some embodiments of FIG. 18, 1808 (after going through 1812 twice). In FIG. 29, a fluorocarbon-based plasma 2900, such as a plasma based on octo-fluorocyclobutane (c-$C_4F_8$) for example, is used to form a third polymer liner 2902 on sidewalls of the third recess 2702. In some embodiments, the third polymer liner 2902 can be formed on the sidewalls and on a bottom surface of the third recess 2702. The third polymer liner 2902 can be composed of C, F, Si, and/or O, and can have a thickness ranging from approximately 10 angstroms to approximately 300 angstroms. In some embodiments, $C_4F_8$ gas can be used to form the third polymer liner 2902, using a gas flow rate of between 10-1000 sccm, a process pressure of between approximately 5 mTorr and 500 mTorr, and a plasma power of 100 watts to approximately 5000 watts, for a deposition time of 0.1 sec to 10 sec.

Figure 30:
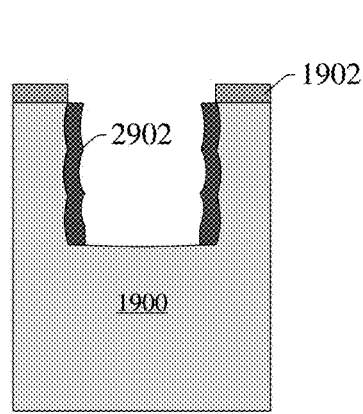
Figure 31:
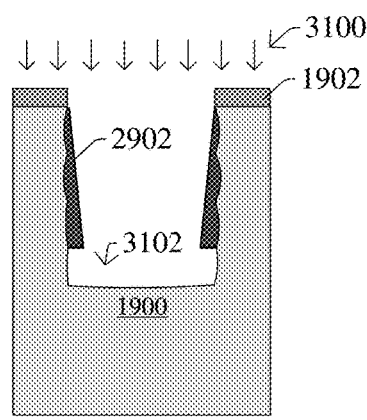

FIGS. 30-31 correspond to some embodiments of FIG. 18, 1810 (after going through 1812 twice). In FIG. 30, the third polymer liner 2902 is removed from the bottom surface of the third recess 2702, but is left in place on sidewalls of the third recess 2702. Then, in FIG. 31, a fluorine-based plasma 3100 is used to etch a fourth recess 3102 into the substrate 1900. Like the first second, and/or third recesses, the fourth recess 3102 has rounded sidewalls that are scalloped in shape as well as a rounded bottom surface. Typically the fluorine-based plasma 3100 used to form the fourth recess 3102 is the same as the fluorine-based plasma 2000, 2300, 2700. This helps to ensure the width of the first, second, third, and fourth recesses are approximately the same and promotes "vertical" trench sidewalls or nearly vertical trench sidewalls. However, if the resultant trench is to be v-shaped, undulating, or have some other sidewall surface geometry, the plasma conditions for 2000, 2300, 2700, 3100 can also be different. In some embodiments, $SF_6$ gas can be used for this etch, using a gas flow rate of between 10-1000 sccm, a process pressure of between approximately 5 mTorr and 500 mTorr, and a plasma power of 100 watts to approximately 5000 watts, for an etch time of 0.1 sec to 10 sec. The fluorine-based plasma 3100 can also "thin" the top sidewall regions of the third polymer liner 2902 to leave thinner upper sidewalls and thicker lower sidewalls.

Figure 32:
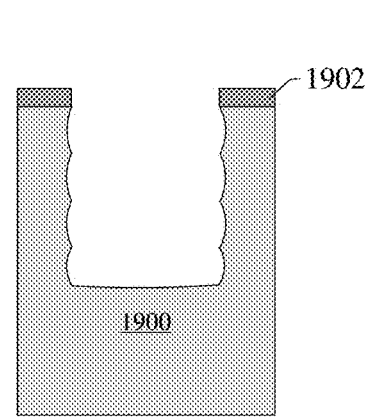

FIG. 32 corresponds to some embodiments of FIG. 18, 1811 (after going through 1812 twice). In FIG. 32, the remaining third polymer liner is removed.

Figure 33:
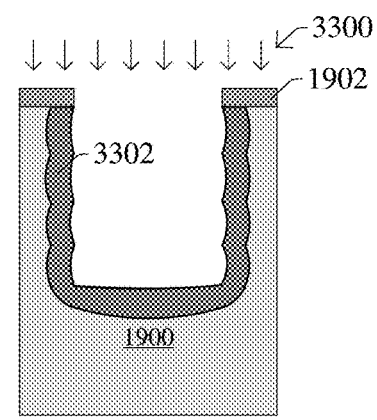

FIG. 33 corresponds to some embodiments of FIG. 18, 1816 (e.g., "YES" at 1814). In FIG. 33, an oxidation process 3300 is carried out to form an oxide layer 3302 along sidewalls and a bottom surface of the fourth recess 3102. In some embodiments, the oxidation process 3300 is a thermal oxidation process, for example, carried out in a furnace. In other embodiments, the oxidation process 3300 can take other forms, such as chemical vapor deposition (CVD), physical vapor deposition (PVD), or atomic layer deposition (ALD) for example.

Figure 34:
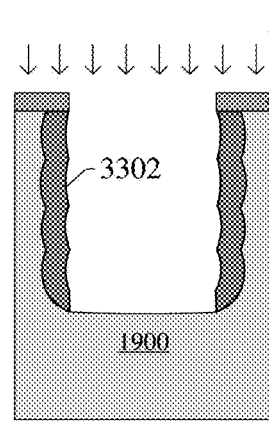

FIG. 34 corresponds to some embodiments of FIG. 18, 1818. In FIG. 34, an etch 3400 is carried out to remove a portion of the oxide layer 3302 from the bottom surface of the fourth recess 3102 and leave a remaining portion of the oxide layer 3302 in place along sidewalls of the fourth recess 3102. The etch 3400 is typically an isotropic etch that is strongly vertical, such as a dry etch and/or highly directional plasma etch.

Figure 35:
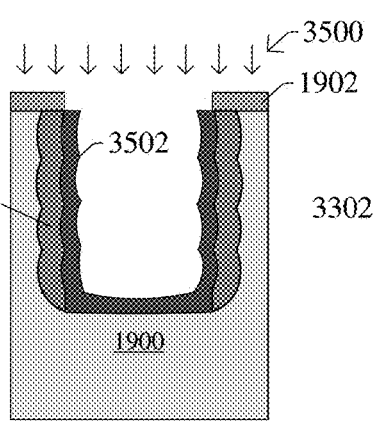

FIG. 35 corresponds to some embodiments of FIG. 18, 1808 (after going through 1820). In FIG. 35 a fluorocarbon-based plasma 3500, such as a plasma based on octofluorocyclobutane ($c-C_4F_8$) for example, is used to form a fourth polymer liner 3502 on inner sidewalls of the oxide layer 3302 and on a bottom surface of the fourth recess 3102. Typically, the fluorocarbon-based plasma 3500 is the same as fluorocarbon-based plasma 2100, 2500, and/or 2900.

Figure 36:
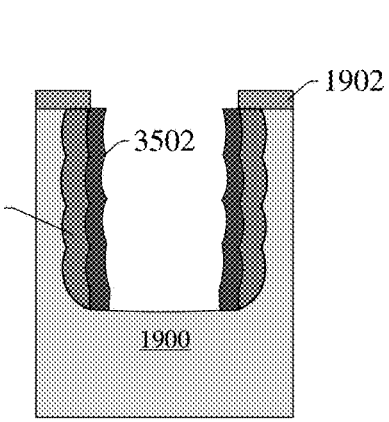
Figure 37:
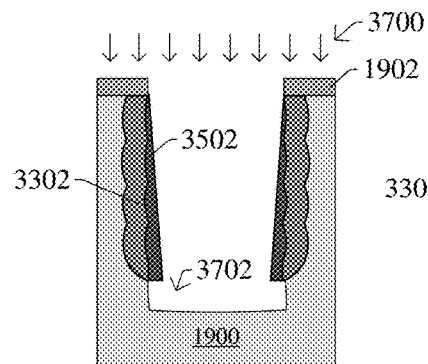

FIGS. 36-37 correspond to some embodiments of FIG. 18, 1810 (after going through 1820). In FIG. 36, the fourth polymer liner 3502 is removed from the bottom surface of the fourth recess 3102, but is left in place on sidewalls of the fourth recess 3102. Then, in FIG. 37, a fifth recess 3702 has been etched, for example by using a fluorine-based plasma 3700. Like the first, second, third, and fourth recesses, the fifth recess 3602 has rounded sidewalls that are scalloped in shape as well as a rounded bottom surface. Typically the fluorine-based plasma 3700 used to form the fifth recess 3602 is the same as the fluorine-based plasma 2000, 2300, 2700, and/or 3100. In some embodiments, $SF_6$ gas can be used for this etch, using a gas flow rate of between 10-1000 sccm, a process pressure of between approximately 5 mTorr and 500 mTorr, and a plasma power of 100 watts to approximately 5000 watts, for an etch time of 0.1 sec to 10 sec. The fluorine-based plasma 3700 can also "thin" the top sidewall regions of the fourth polymer liner 3502 to leave thinner upper sidewalls and thicker lower sidewalls.

Figure 38:
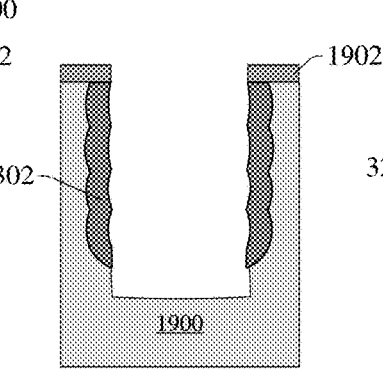

FIG. 38 corresponds to some embodiments of FIG. 18, 1811 (after going through 1820). In FIG. 38, the remaining fourth polymer liner 3502 is removed.

Figure 39:
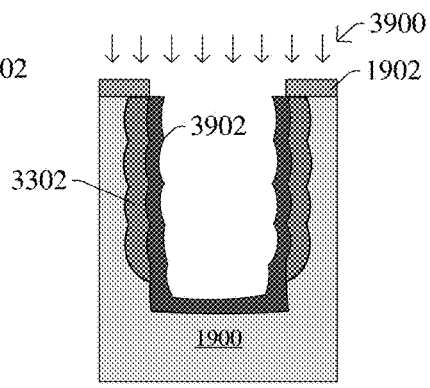

FIG. 39 corresponds to some embodiments of FIG. 18, 1808 (after going through 1820). In FIG. 39 a fluorocarbon-based plasma 3900, such as a plasma based on octofluorocyclobutane ($c-C_4F_8$) for example, is used to form a fifth polymer liner 3902 on inner sidewalls of the oxide layer 3302 and along inner sidewalls of the fifth recess 3702. Typically, the fluorocarbon-based plasma 3900 is the same as fluorocarbon-based plasma 2100.

Figure 40:
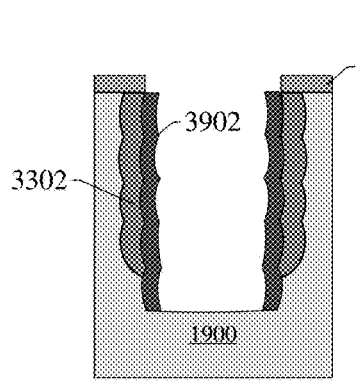
Figure 41:
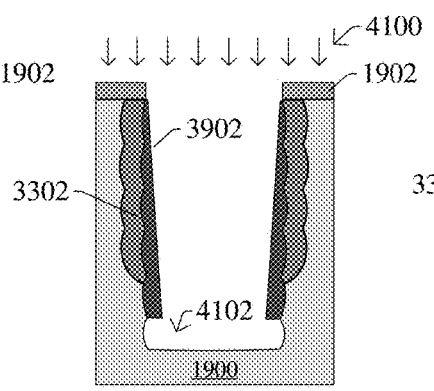

FIGS. 40-41 correspond to some embodiments of FIG. 18, 1810. In FIG. 40, the fifth polymer liner 3902 is removed from the bottom surface of the fifth recess 3702, but is left in place on sidewalls of the fifth recess 3702. Then, in FIG. 41, a sixth recess 4102 has been etched, for example by using a fluorine-based plasma 4100. Like the first, second, third, fourth, and fifth recesses, the sixth recess 4102 has rounded sidewalls that are scalloped in shape as well as a rounded bottom surface. Typically the fluorine-based plasma 4100 used to form the sixth recess 4102 is the same as the fluorine-based plasma 2000. In some embodiments, $SF_6$ gas can be used for this etch, using a gas flow rate of between 10-1000 sccm, a process pressure of between approximately 5 mTorr and 500 mTorr, and a plasma power of 100 watts to approximately 5000 watts, for an etch time of 0.1 sec to 10 sec. The fluorine-based plasma can also "thin" the top sidewall regions of the fifth polymer liner 3902 to leave thinner upper sidewalls and thicker lower sidewalls.

Figure 42:
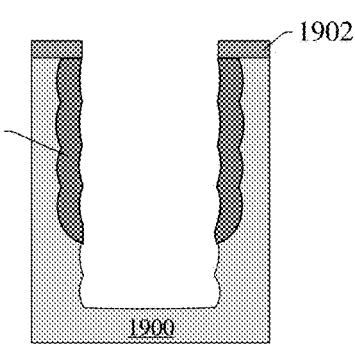

FIG. 42 corresponds to some embodiments of FIG. 18, 1811. In FIG. 42, the remaining fifth polymer liner is removed. Further, in FIG. 42, when the total number of etch cycles reaches a predetermined number (M) and/or when the total trench depth reaches a desired total depth, $d_t$, trench 4204 can be complete and trench etching process stops, and additional processing can be performed.

The conditions for the etching, deposition, and oxidation processes used in FIGS. 19-42 can vary widely depending on the desired etch rate, aspect ratio, and sidewall smoothness desired. Generally, etch processes with shorter duration for each cycle result in a slower etch but with smaller sidewall scallops, while etch processes with longer duration for each cycle result in a faster etch but with larger sidewall scallops. The endpoint for the Bosch process can occur when the number of cycles reaches a predetermined number at which the desired trench depth, $d_t$, is expected to be reached, or can occur by performing real-time monitoring of the trench depth and stopping the process when measurement indicates the desired trench depth is reached.

Figure 43:
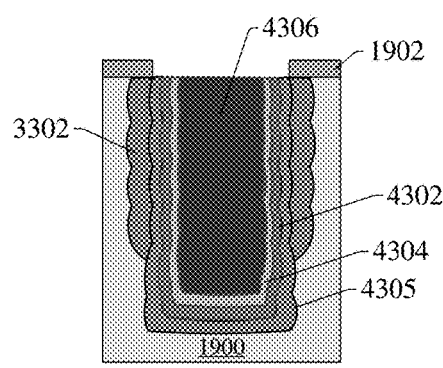

In FIG. 43, additional processing can be performed (see e.g., FIG. 18, 1822). For example, alternating conductive layers (e.g., 4302, 4304) and insulating layers (e.g., 4305, 4306) can be conformally formed along the trench sidewalls and bottom surface to build-up a capacitor structure in the trench. The conductive layers can comprise a metal, or polysilicon for example, and the insulating layers can comprise silicon dioxide or a high-k dielectric material.

By promoting a good overall throughput, this procedure provides a high-throughput Bosch process with relatively smooth sidewalls, which may be useful in many applications, such as in decoupling capacitors, MEMS devices, CMOS devices, and DRAM, among others.

Figure 44:
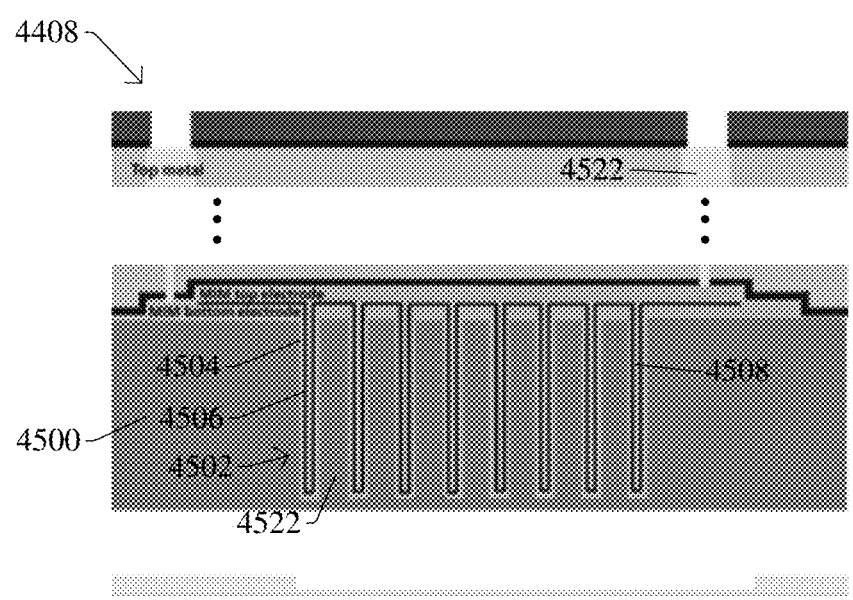
FIG. 44 shows a decoupling capacitor in accordance with some embodiments.

FIG. 44 illustrates an example of a die 4408 according to some embodiments. As illustrated, the die 4408 can include a semiconductor substrate 4500 that includes a number of trenches 4502 that help establish a metal-insulator-metal (MIM) capacitor in an upper surface of the substrate. A bottom electrode layer 4504, insulating layer 4506, and top electrode layer 4508 are conformally arranged within the trenches. At least one via and contact pad are coupled the bottom electrode layer 4504, through a dielectric structure and etch stop layers to make electrical contact with the bottom electrode layer 4504. At least one via and contact pad are coupled the top electrode layer 4508, through the dielectric structure and etch stop layers to make electrical contact with the top electrode layer 4508. In some embodiments, each trench has a trench width of between 0.1 micrometers and 1 micrometer, and silicon pillars 4522 separate neighboring trenches from one another. The silicon pillars 4522 can have respective widths of between 0.1 micrometers and 1 micrometer, and there can be between 1 and 100 trenches per unit MIM capacitor cell. The depth of the trenches can range between 1 micrometer and 30 micrometers in some embodiments. The trenches in FIG. 44 can exhibit the detailed structural features previously illustrated and described, for example in FIGS. 16-17 and FIGS. 42-43, among others.

In some embodiments, a semiconductor package may include a substrate, a plurality of dies stacked together, such as the die 4408, and a molding. The stacked dies are electrically connected by several connectors. The substrate can include a number of conductive pads on outer surfaces thereof, and the conductive features may include vias and metal lines that form electrical connections between the various pads, typically without any active devices such as transistors on the substrate. In some embodiments, the dies are bonded over the substrate by several conductive bumps. In some embodiments, the conductive bump is disposed between the substrate and the die. In some embodiments, the die is electrically connected to the substrate through the conductive bump. Conductive bumps are on an underside of the substrate.

In some embodiments, the die 4408 is disposed below the substrate, and is disposed in a plane traversing the conductive bumps. In some embodiments, the die 4408 is surrounded by the conductive bumps. In some embodiments, the die 4408 is fabricated with a predetermined functional circuit within the die 4408. In some embodiments, the die 4408 is an integrated passive die (IPD) that includes a capacitor, a passive device or the like. In some embodiments, the die 4408 is a chip or a package. In some embodiments, IPD capacitors are placed directly beneath the substrate to provide more accessible and effective supply noise decoupling. In some embodiments, the IPD capacitors are realized as high-density trench capacitors built in 180 nm CMOS, wherein each IPD capacitor offers 97 nF of additional capacitance, with a 1 MHz equivalent series resistance (ESR) of 47 mΩ and ESL of 0.51 pH. In some cases, this can result in 3.9% higher maximum clock frequency at a core supply of 1.135V.

Thus, it will be appreciated that some embodiments relate to a method. In the method a substrate is provided, and a first recess is etched in a selected region of the substrate. A first polymer liner is formed on sidewalls and a bottom surface of the first recess. A portion of the first polymer liner is removed from the bottom surface of the first recess, but a remaining portion of the first polymer liner is left along the sidewalls of the first recess, and the first recess is deepened to establish a second recess in the selected region of the substrate while the remaining portion of the first polymer liner is along the sidewalls of the first recess. The remaining portion of the first polymer liner is removed after the second recess has been established. A first oxide liner is formed along the sidewalls of the first recess and along sidewalls and a bottom surface of the second recess. A portion of the first oxide liner is removed from a bottom surface of the second recess, while a remaining portion of the first oxide liner is left on the sidewalls of the first recess and the sidewalls of the second recess.

Another embodiment relates to a method in which a substrate is provided. In the method, a trench is etched in a selected region of the substrate. A first number of etch cycles is performed consecutively on the trench. The first number of etch cycles is greater than one and each etch cycle of the first number of etch cycles includes: (a) forming a polymer liner on sidewalls of the trench; (b) removing a portion of the polymer liner from a bottom region of the trench but leaving a remaining portion of the polymer liner along the sidewalls of the trench; and (c) performing an etch while the remaining portion of the polymer liner is along the sidewalls of the trench to deepen the trench. After the first number of etch cycles are performed consecutively, a first oxidation is performed to form a first oxide liner along sidewalls of the deepened trench and along a bottom surface of the deepened trench. A portion of the first oxide liner is removed from a bottom surface of deepened trench, while a remaining portion of the first oxide liner is left on sidewalls of the deepened trench.

Still another embodiment relates to a semiconductor device. The device includes a semiconductor substrate including a trench extending downward into an upper surface of the semiconductor substrate. The trench includes a bottom surface and a plurality of scallops along sidewalls of the trench. An oxide layer lines the bottom surface and the sidewalls of the trench. The oxide layer has varying thicknesses along the sidewalls of the trench at different depths, and the varying thicknesses step down at discrete increments as a depth into the trench increases.

It will be appreciated that identifiers such as "first" and "second" do not imply any type of ordering, placement, or temporal relationship with respect to other elements; but rather "first" and "second" and other similar identifiers are just generic identifiers and these elements can be swapped in other implementations. Thus, while methods illustrated and described herein may be illustrated and/or described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a substrate;
   etching a first recess in a selected region of the substrate;
   forming a first polymer liner on sidewalls and a bottom surface of the first recess;
   removing a portion of the first polymer liner from the bottom surface of the first recess but leaving a remaining portion of the first polymer liner along the sidewalls of the first recess, and deepening the first recess to establish a second recess in the selected region of the substrate while the remaining portion of the first polymer liner is along the sidewalls of the first recess;
   removing the remaining portion of the first polymer liner after the second recess has been established;
   forming a first oxide liner along the sidewalls of the first recess and along sidewalls and a bottom surface of the second recess; and
   removing a portion of the first oxide liner from a bottom surface of the second recess, while leaving a remaining portion of the first oxide liner on the sidewalls of the first recess and the sidewalls of the second recess.

2. The method of claim 1, further comprising:
   forming a second polymer liner on the bottom surface of the second recess and along inner sidewalls of the remaining portion of the first oxide liner in the first recess and in the second recess.

3. The method of claim 2, further comprising:
   removing a portion of the second polymer liner from the bottom surface of the second recess, and deepening the second recess in the selected region of the substrate to form a third recess, wherein the third recess has a bottom surface that extends to a depth below a bottom surface of the first oxide liner and below a bottom surface of the second polymer liner.

4. The method of claim 3, wherein when the portion of the second polymer liner is removed from the bottom surface of the second recess, a remaining portion of the second polymer liner remains along the inner sidewalls of the remaining portion of the first oxide liner in the first recess and in the second recess, and further comprising:
   removing the remaining portion of the second polymer liner after the third recess has been established; and
   forming a second oxide liner along sidewalls of the third recess and along a bottom surface of the third recess.

5. The method of claim 4, further comprising:
   removing a portion of the second oxide liner from the bottom surface of the third recess, while leaving a remaining portion of the second oxide liner on sidewalls of the third recess.

6. The method of claim 4, wherein after the second oxide liner is formed, the sidewalls of the first recess are covered with a first thickness of oxide, and the sidewalls of the third recess are covered with a second thickness of oxide, the first thickness of oxide being greater than the second thickness of oxide.

7. The method of claim 6, wherein the first thickness is no more than 50% greater than the second thickness.

8. A method, comprising:
   providing a substrate;
   etching a trench in a selected region of the substrate;
   performing a first number of etch cycles consecutively on the trench, the first number of etch cycles being greater than one and each etch cycle of the first number of etch cycles comprising:
      (a) forming a polymer liner on sidewalls of the trench;
      (b) removing a portion of the polymer liner from a bottom region of the trench but leaving a remaining portion of the polymer liner along the sidewalls of the trench; and
      (c) performing an etch while the remaining portion of the polymer liner is along the sidewalls of the trench to deepen the trench;
   after the performing of the first number of etch cycles consecutively, performing a first oxidation to form a first oxide liner along sidewalls of the deepened trench and along a bottom surface of the deepened trench; and
   removing a portion of the first oxide liner from a bottom surface of deepened trench, while leaving a remaining portion of the first oxide liner on sidewalls of the deepened trench.

9. The method of claim 8, further comprising:
   after the first oxide liner has been removed from the bottom surface of the deepened trench, performing a second number of the etch cycles consecutively to further deepen the deepened trench.

10. The method of claim 9, further comprising:
    after the performing of the second number of the etch cycles consecutively, performing a second oxidation to form a second oxide liner along sidewalls of the further deepened trench and along a bottom surface of the further deepened trench.

11. The method of claim 10, wherein the second oxidation increases a thickness of the first oxide liner to a first thickness and forms the second oxide liner with a second thickness that is less than the first thickness.

12. The method of claim 11, wherein the second oxidation is a thermal oxidation process.

13. The method of claim 10, further comprising:
    removing a portion of the second oxide liner from a bottom surface of the further deepened trench, while leaving a remaining portion of the second oxide liner on sidewalls of the further deepened trench; and
    performing a third number of the etch cycles consecutively to form a final trench with a predetermined depth.

14. The method of claim 13, wherein when the second oxide liner is formed, the further deepened trench has uppermost sidewalls and lowermost sidewalls that are lined with oxide, wherein the oxide lining the uppermost sidewalls has a first thickness and the oxide lining the lowermost sidewalls has a second thickness, the first thickness being greater than the second thickness.

15. A method, comprising:
    providing a substrate;
    providing a mask over the substrate, wherein an opening in the mask defines a selected region of the substrate;
    performing an etch with the mask in place to form a first recess having first scallop-shaped sidewalls in the selected region of the substrate;

forming a first liner of a first material on the first scallop-shaped sidewalls and on a bottom surface of the first recess;

removing a portion of the first liner from the bottom surface of the first recess but leaving a remaining portion of the first liner along the first scallop-shaped sidewalls of the first recess, and deepening the first recess to establish a second recess having second scallop-shaped sidewalls stacked beneath the first scallop-shaped sidewalls in the selected region of the substrate while the remaining portion of the first liner is along the first scallop-shaped sidewalls of the first recess;

removing the remaining portion of the first liner after the second recess has been established;

forming a second liner of a second material along the first scallop-shaped sidewalls of the first recess, along the second scallop-shaped sidewalls of the second recess, and along a bottom surface of the second recess, the second material differing from the first material; and removing a portion of the second liner from a bottom surface of the second recess, while leaving a remaining portion of the second liner on the first scallop-shaped sidewalls of the first recess and the second scallop-shaped sidewalls of the second recess.

16. The method of claim 15, wherein the first material is a first polymer.

17. The method of claim 15, wherein the second material is an oxide.

18. The method of claim 17, wherein the first material is a polymer.

19. The method of claim 15, wherein the first liner is a first polymer liner, and the second liner is a first oxide liner, further comprising:

forming a second polymer liner on the bottom surface of the second recess and along inner sidewalls of the remaining portion of the first oxide liner in the first recess and in the second recess.

20. The method of claim 19, further comprising:

removing a portion of the second polymer liner from the bottom surface of the second recess, and deepening the second recess in the selected region of the substrate to form a third recess, wherein the third recess has a bottom surface that extends to a depth below a bottom surface of the first oxide liner and below a bottom surface of the second polymer liner.

* * * * *